(12) United States Patent
Pellenc et al.

(10) Patent No.: US 11,130,251 B2
(45) Date of Patent: Sep. 28, 2021

(54) CONTROL DEVICE FOR A POWER TOOL AND SAFETY TOOL COMPRISING SUCH A CONTROL DEVICE

(71) Applicant: PELLENC, Pertuis (FR)

(72) Inventors: Roger Pellenc, Pertuis (FR); Bernard Lopez, La Tour d'Aigues (FR)

(*) Notice: Subject to any disclaimer, the term of this patent is extended or adjusted under 35 U.S.C. 154(b) by 8 days.

(21) Appl. No.: 16/646,819

(22) PCT Filed: Nov. 20, 2018

(86) PCT No.: PCT/FR2018/052915
§ 371 (c)(1),
(2) Date: Jul. 29, 2020

(87) PCT Pub. No.: WO2019/102130
PCT Pub. Date: May 31, 2019

(65) Prior Publication Data
US 2021/0039274 A1 Feb. 11, 2021

(30) Foreign Application Priority Data

Nov. 23, 2017 (FR) .................................. 11/71255
Nov. 23, 2017 (FR) .................................. 17/71254

(51) Int. Cl.
| B26D 7/24 | (2006.01) |
| A01G 3/037 | (2006.01) |
| F16P 3/12 | (2006.01) |
| H03K 17/96 | (2006.01) |

(52) U.S. Cl.
CPC .............. *B26D 7/24* (2013.01); *A01G 3/037* (2013.01); *F16P 3/12* (2013.01); *H03K 17/9645* (2013.01)

(58) Field of Classification Search
CPC .. B26D 7/24; A01G 3/037; F16P 3/12; H03K 17/9645
(Continued)

(56) References Cited

U.S. PATENT DOCUMENTS

| 4,029,996 A | * | 6/1977 | Miffitt | ................. | H02H 11/005 |
| | | | | | 307/326 |
| 5,025,175 A | * | 6/1991 | Dubois, III | ............... | F16P 3/12 |
| | | | | | 307/326 |

(Continued)

FOREIGN PATENT DOCUMENTS

| DE | 2413999 A1 | 9/1975 |
| DE | 19926241 A1 | 5/2002 |

(Continued)

OTHER PUBLICATIONS

English Translation of the International Search Report for corresponding PCT/FR2018/052915.

(Continued)

*Primary Examiner* — Tomi Skibinski

(57) ABSTRACT

Disclosed are a control device for a power tool and a power tool provided with the control device. The control device includes an operation control interface which is provided with a manually operated controller; an impedance-measuring safety interface, wherein the impedance-measuring interface includes a first manual contact electrode and a second manual contact electrode which are electrically isolated from each other, and wherein the manual contact electrodes are provided on the controller and extend over a manual bearing surface of the controller. The device is suitable for controlling and ensuring the safe use of power tools, especially electrical tools, such as pruning shears.

16 Claims, 6 Drawing Sheets

(58) Field of Classification Search
USPC .............................................................. 83/13
See application file for complete search history.

(56) References Cited

U.S. PATENT DOCUMENTS

| | | | | |
|---|---|---|---|---|
| 6,590,171 | B1* | 7/2003 | Wolf | G05G 1/06 |
| | | | | 200/51 LM |
| 7,365,955 | B2* | 4/2008 | Mather | F16P 3/145 |
| | | | | 361/160 |
| 2010/0044120 | A1* | 2/2010 | Richter | G06F 3/016 |
| | | | | 178/18.01 |

FOREIGN PATENT DOCUMENTS

| | | | |
|---|---|---|---|
| EP | 2490865 | A1 | 8/2012 |
| EP | 2825811 | A1 | 1/2015 |
| FR | 2712837 | A1 | 6/1995 |
| FR | 2779669 | A1 | 12/1999 |
| FR | 2831476 | A1 | 5/2003 |
| FR | 2838998 | A1 | 10/2003 |
| FR | 2846729 | B1 | 2/2005 |
| FR | 2963081 | A1 | 1/2012 |
| FR | 3001404 | A1 | 8/2014 |
| WO | 9219905 | A1 | 11/1992 |
| WO | 2006045988 | A1 | 5/2006 |
| WO | 2012025456 | A1 | 3/2012 |
| WO | 2017101964 | A1 | 6/2017 |

OTHER PUBLICATIONS

English Translation of the Written Opinion of the ISA for corresponding PCT/FR2018/052915.

* cited by examiner

CONTROL DEVICE FOR A POWER TOOL AND SAFETY TOOL COMPRISING SUCH A CONTROL DEVICE

TECHNICAL FIELD

The present invention concerns a control device for starting or stopping a power tool and a safe tool including such a control device. A control device is understood to be a device for starting or stop the tool or to modify the operation of the tool while it is use. Modification of the operation may be a continuous or discontinuous modification of a rotation speed in the case of a tool presenting a rotating active component. It may also be a modification of the relative position of all or part of an active component. In the particular case of a power pruning shears, this concerns the opening and closing of the cutting blade on the cutting hook, as an example.

Modification of the operation may also include a modification of an operating mode of the tool. For example, for pruning shears this may mean passage from an operating mode with proportional closing of the blade to an impulsional operating mode of all or nothing.

Modification of the operation of the tool may also be a modification of a caliber or an operating range. Still with reference to pruning shears this concerns, for example, the control of a modification of the maximum opening of the cutting blade relative to the cutting hook or of the maximum stroke of the blade.

The tool is considered to be safe when it is provided with an automatic emergency stop device for the purpose of preventing injury to an operator or, at least, to limit the severity of a wound of an operator in cased of unintentional contact of the operator with an active component of the tool.

The emergency stop device is considered to be automatic if the emergency stop is triggered without voluntary intervention by the operator, but upon the simple detection of a situation where there is a risk injury.

The invention finds applications for machine tools, such as for example circular saws, or for portable power tools and in particular for cutting tools presenting a mobile blade or an active sharp or blunt component. The invention finds applications especially for shears, pruning shears, chain saws, saws, grinders or drills.

STATE OF PRIOR ART

An illustration of the state of the art is given by the following documents:
FR 2712837
FR 2779669
FR 2831476
FR 2838998
FR 2846729
FR 2963081
FR 3001404
EP 2490865
EP 2825811
U.S. Pat. No. 5,025,175
U.S. Pat. No. 7,365,955
WO2012/025456

These documents refer to machines and tools with electric controls provided with an emergency stop device to avoid injury to an operator.

Among these documents are to be found numerous tools such as electric pruning shears for single hand use for trimming vegetation. In this case, the operators hold the electric pruning shears in one hand and their second free hand for handling the already cut or to be cut plant. A risk of injury exists when the hand not holding the pruning shears comes into immediate proximity or into contact with the cutting element during the cut. In the case of pruning shears or scissors, the cutting element presents itself in most cases in the form of a fixed blade or hook, and a pivoting blade. The pivoting blade pivots between an open position and a closed position on the hook, with a shearing effect between the pivoting blade and the hook. The cutting element of certain pruning shears may also consist of two mobile blades cooperating with each other in order to achieve the shearing effect when the blades pass from an open position to a closed position.

In the case of drills, grinders, circular or chain saws, the cutting element presents cutting parts in rotation around an axis.

In the case of machine tools such as shears, crushers or circular saws, cutting elements present themselves in the form of cutting parts rotating around an axis or in translatory motion relative to a fixed frame.

Various means are employed to detect the immediate proximity or the contact of the hand with the cutting element. One can distinguish in particular radio-electric means, potential detecting means on the blade, capacitive means or also impedance measuring means.

The known safety devices employ gloves, shoes or also a beacon, electrically connected to the safety device by a communication link. The link may be a wire link or possibly by Hertzian wave.

When gloves are used, the gloves are equipped with electric conductors and their function is to create a measuring circuit between the glove and the cutting element. Similarly, conductive shoes may be used to create a measuring circuit connected to the ground and including the operator's body.

The use of electronic beacons, conductive gloves, conductive shoes or more generally of a conductive item of clothing electrically connected to the cutting tool, serves to detect a contact of the operator with the cutting element. An emergency stop of the cutting operation, in response to the detection of the contact of the conductive item of clothing with the cutting element, makes it possible to avoid or limit the severity of a possible injury.

The known safety devices do however present a certain number of difficulties or drawbacks for the operator. These include in particular, the following:

the discomfort caused by a wired connection between the conductive clothing and the pruning shears, a risk of severing the wired link between the conductive clothing and the pruning scissors.

RELATED APPLICATIONS

The invention resumes a certain number of characteristics of the inventions disclosed in the patent applications FR 17/71254 and FR 17/71255 and to which reference is being made. It constitutes an improvement of them.

DISCLOSURE OF THE INVENTION

The invention aims to overcome the difficulties encountered with the equipment of the state of the art It also aims to propose the replacement of an existing control device by an improved control device integrating at the same time operating functions, for example an active component control and safety functions.

Another aim of the invention is to propose a control device and a tool integrating the control device, which is ergonomic and reliable, particularly as far as the safety functions are concerned.

To achieve these aims, the invention proposes more precisely a control device for power tools, including:

an operation control interface provided with a manually actuated controller, presenting a manual bearing surface for moving the controller between an off-position and at least one operating position, an impedance-measuring safety interface including first manual contact electrode and a second manual contact electrode, electrically insulated from each other.

The manual contact electrodes are positioned on the controller and extend on the manual bearing surface of the controller.

The control device may be intended for the control of a power tool and in particular of a power cutting tool.

A first interface of the control device is the operation control interface, i.e. an interface governing the operation of the tool. The operation control interface may be an electric interface in the sense where it emits an electrical signal, modifies an electrical signal or modifies an electric property of a control circuit for example a resistance, capacitance, inductance or a frequency of a signal of a control circuit. In a very simple expression of the operation control interface, it can be summarized by a switch capable of serving as power-on or power-off of an electric power supply of an electric motor. It may also include a speed controller, variable resistance or variable capacitor for generating a variable signal as a function of a movement or a position of the manual actuation controller. The control interface may also include an optical sensor, for example a distance sensor measuring a position of the controller and producing a signal based on this position.

The controller is part of the operation control interface. It allows an operator to enter the controls essentially by pushing on the controller or by modifying the position of the controller. The controller may present itself in the form of a pushbutton, lever trigger or a detent for example.

Although the operation control interface is preferably an electric interface, it may also be a mechanical interface acting for example, on the intake of a heat drive engine.

The movement of the controller essentially is between an off position, corresponding to the stop of the tool and at least one operating position corresponding for example to the work of the tool. The work of the tool is essentially understood to be the setting in motion of an active component of the tool. This aspect is being described further down.

More precisely, the controller may be in a stop or off-position in which no command is transmitted and in which a tool equipped with the control device is at a stop or standby. The controller may also be in one or several operating positions corresponding to one or several operating conditions or modes of the tool or at a proportional operation of the tool, in the case of a command proportional to the amplitude of movement of the controller.

By way of examples, a proportional control may govern a variable rotational speed in the case of a drill or recessing machine. A proportional control may also govern a relative position of a cutting blade of pruning shears in relation to a hook of pruning shears.

The controller is considered to be manual when it is intended to be actuated by a hand, with a single finger, a number of fingers or perhaps by another part of the hand such as the palm. The hand may be bare, totally or partially covered by an electrically conductive glove, in particular at its contact with the controller.

Mention of the operator's hand in the description below does not prejudge the fact that the hand be bare or covered with a conductive glove and does not prejudge the part of the hand or the finger operating the control.

The manual bearing surface of the controller designates the part or parts of the controller coming into contact with the operator's hand when the operator actuates the controller. The activation occurs for example by exerting pressure on the bearing surface of the controller.

A second interface of the control device, distinct from the operation control interface, is the impedance-measuring interface. Impedance-measuring interface is understood to mean an interface for measuring or comparing one or several impedances, and, by extension, one or several electric characteristics dependent on an impedance. It is, for example, an ohmic impedance, a voltage and/or current varying proportionally to an impedance. In particular, the first and the second electrode of the impedance-measuring interface may be part of a same electric circuit or two separate electric circuits for the establishment of electric characteristics to be compared. A more detailed description of possibilities of utilization of the impedance-measuring interface is given below.

Advantageously, since the manual contact electrodes of the impedance-measuring interface extend on the bearing surface of the controller, it is possible to detect the presence of an operator's hand in contact with the impedance-measuring interface, simultaneously with the two manual contact electrodes, at the moment where the operator actuates the controller by pushing on this component.

Additionally, the impedance-measuring interface may include or may be associated with at least one electrically conductive glove worn by the operator of the control device. Electrically conductive glove is understood to be a conductive glove in its entirety or a glove including an electrically conductive part associated to a part of the operator's hand at the contact of the controller. It is, for example, an electrically conductive fingerstall for a controller associated with a finger of the hand. The conductive character of the glove refers to the outer part of the glove that may be capable of touching the impedance-measuring interface to reduce the contact impedance with the manual contact electrodes of the impedance-measuring interface. It also applies from the inner part of the glove coming into contact with the operator's hand. In this case, the inner conductive part and the outer conductive part are electrically connected to each other to establish a contact between the operator's hand and the manual contact electrodes. Preferably, and in order to establish a good level of weak impedance contact between the hand and the glove, a large contact surface is given preference and the inner part of the glove may be entirely conductive. The conductive glove may include conductive metal fibers (silver, stainless steel, nickel, etc.) or carbon-based fibers for example.

By return to the controller, and according to an advantageous possibility of implementation of this component, it may present at least one of a first recessed relief, and an electrically insulating separator including a material chosen among a moisture-absorbent and a water-repellent material, the first recessed relief, respectively the separator, extending on the manual bearing surface, between the first manual contact electrode and the second manual contact electrode.

The function of the first recessed relief or the separator is to prevent the formation of a conductive bridge between the first and the second electrode due to moisture that may accumulate on the controller and thereby distort the detection of the operator's contact on the impedance-measuring interface. The moisture that may accumulate on the controller can come at the same time from either the surroundings or the operator's perspiration. For example, when the control device is part of a pruning shears, moisture in the controller can result from the use of the pruning shears in a vineyard or a sapping orchard, during or after a rainfall or on plants covered with dew.

In the case of a thin damp film on the controller, the recessed relief(s) can form a barrier against film rupture. In the case of more intense moisture, the recessed relief(s) can also be used to trap moisture by capillarity action or to provide a channel or drain for the evacuation of moisture.

To further improve the barrier against any film rupture provided by the first recessed relief, this may be a relief with angular edges.

The controller may also include a separator capable of absorbing and then draining moisture, or, on the contrary, capable of repelling moisture. It prevents a film of moisture and thus an unintended contact of low impedance between the two manual contact electrodes in the absence of manual contact. The separator may be provided instead of the recessed relief, or in addition to the recessed relief while presenting the same effects.

The separator may be made of a moisture-absorbing material, for example, porous ceramics. The separator may also be made of a water-repellent material such as PVDF (Polyvinylidene fluoride), PTFE (Polytetrafluoroethylene), Teflon (Polytetrafluoroethylene, or a closed cell foam made of water-repellent materials. It may be solid or be in the form of a surface coating. The separator may also be used to constitute a spacer between the manual contact electrodes or a support of the manual contact electrodes.

According to a preferred configuration in which the controller presents an elongated shape, the first and the second manual contact electrode and said first recessed relief may extend longitudinally on the controller.

The controller can be produced in different ways; it can include, for example, either a lever trigger or a pushbutton.

Depending on the case, the actuation of the controller can be done by pressing the controller so as to press it down in the direction of its base or so as to make it pivot, in the case of a pivoting lever.

According to a particular possibility of production of the controller in which the controller is a lever, the first recessed relief may extend on a first face of the lever forming the manual bearing surface. The lever may include at least one second recessed relief extending on a second face of the lever opposite to the first face of the lever.

The first recessed relief and the second recessed relief may be simple, split or in the form of several adjacent reliefs, for example.

According to another possibility of production of the controller in which the controller is a lever, the first recessed relief may include a recessed space traversing the lever between a first face of the level and a second face of the lever, opposite the first face of the lever. The traversing recessed space can thus allow moisture to flow towards a face of the lever that does not include the electrodes, for example. The recessed space also makes it possible to detect the presence of the operator's hand at the controller through the intermediary of a possible optical sensor positioned opposite to the second face.

The first face of the lever and the second face of the lever may be, for example, faces parallel to the pivot axis of the lever. One of the faces may constitute or be part of the bearing surface of the controller, thus receiving the operator's finger or hand to actuate the lever.

The controller, whether a pushbutton or a lever, may include a central body in an electrically insulating material and fittings made of an electrically conductive material set in the lateral flanks of the central body, the fittings forming respectively the first manual contact electrode and the second manual contact electrode.

The lateral flanks of the central body are considered to be parallel flanks to a movement plane of the controller between the off-position and the operating position. The central body serves to insulate electrically, from each other, the metallic fittings and consequently the manual contact electrodes. The central body may also serve as a support for the metallic fittings.

The controller may be charged by a return spring returning the controller from an operating position to the stop position when the operator releases the pressure exerted on the bearing surface.

The invention also concerns a safe power tool including:
an active electrically conductive component,
an electrically insulated control device of the active component,
a drive motor of the active component
a monitoring device with comparator of electrical characteristics, responsive to an operator's contact with the active component,
an emergency stop device for the active component, servo-driven by the monitoring device.

In accordance with the invention:
the control device is in conformance with the one described previously,
the drive motor of the active component is controlled through the intermediary of the operation control interface of the control device and
the monitoring device includes the safety impedance-measuring interface of the control device.

The tool may be a machine tool or a portable tool, it may be a tool powered by a heat engine or preferably an electric power tool. The emergency stop device may include different components, the functions of which are to interrupt the power supply to the drive motor; to brake the drive motor; to brake the active component and/or to impede the active component. The emergency stop may also consist in triggering an opposing emergency movement to counter a normal movement of the active component and to offset the kinetic energy of any components in motion. The components in motion may be those of the active component, the drive motor of the active component or a transmission connecting the motor to the active component.

In particular, when the drive motor is an electric motor, an electronic control card may be provided to control electromagnetic braking functions using the electric motor. An electromagnetic brake may also act on a flywheel of the motor or even directly on the active component.

All or part of the active component is made of an electrically conductive material. However, this does not prejudge the presence or not of a possible insulating coating on its surface. The active component being capable to intervene, as described further down, in the monitoring of the utilization of the tool through an ohmic or capacitive contact of the operator with the active component.

The active component may be in particular a cutting element. It may include a cutting blade of a shear or pruning shears. The active component may also include the spindle of a drill or a recessing machine, equipped with a drill or a milling cutter, if applicable.

The control device of the invention has a dual function. A first function is an interface function allowing the operator to enter operating controls for the tool. These may be all-or-nothing controls, such as the activation of the tool, the launch of a particular operating mode of the tool or the return of the tool to a stop or a standby mode. The controls may also be proportional controls governing, for example, a rotational speed of the drive motor and/or of the active component, or proportional movement controls of all or part of the active component.

The control device also has a monitoring function by way of the monitoring device of the tool which includes the impedance-measuring interface of the control device.

Several possibilities of configuration of the monitoring device and utilization of the impedance-measuring interface are described below.

According to a first possibility, the monitoring device may include:
- a first electric circuit including the first manual contact electrode, a first electrical impedance and the active component. The first electric circuit is capable of closing upon a simultaneous contact of the operator with said first manual contact electrode and the active component,
- a second electric circuit including the first and the second manual contact electrode, the first electrical impedance and the second electrical impedance; the second electric circuit is capable of closing upon a simultaneous contact of the operator with the first and the second manual contact electrode,
- at least one measuring device of an impedance characteristic of the first electric circuit and an impedance characteristic of the second electric circuit,
- a comparator of the impedance characteristic of the first electrical circuit and of at least one threshold characteristic dependent on the impedance characteristic of the second electrical circuit, the comparator being connected to the emergency stop device to cause an emergency stop in case of the threshold characteristic being crossed.

The terms "first impedance" or "second impedance" designate respectively one or several electronic components capable of including a resistive component but also an inductive and/or a capacitive component. In a preferred implementation, the first impedance and the second impedance may be formed each by an electronic component such as an electric resistance of defined value. The first impedance and the second impedance thus present fixed and known Ohms values.

Furthermore, and concerning the first and the second electric circuit, "impedance characteristic" means a value of voltage, current, an ohmic value, or more generally an electric characteristic connected respectively to the impedance of the first electric circuit and the second electric circuit. The impedance characteristic is established by the measuring device. The threshold characteristic can also be a value of voltage, current or an Ohmic value which is dependent on the impedance characteristic of the second electric circuit. It may especially be proportional to the impedance characteristic of the second electric circuit or equal to this impedance characteristic.

The simultaneous contact of the operator's hand with the first and the second manual contact electrode of the impedance-measuring interface enables the electric connection of these electrodes through the intermediary of the operator's hand, with an impedance corresponding essentially to the sum of the contact impedances between the hand and each of the first and the second manual contact electrodes.

To ensure a good physical and electric contact, the operator's hand used for actuating the control device may be covered by an electrically conductive glove, at least at the glove surfaces facing the manual bearing surface, reducing the contact impedances. The following description does not prejudge the use or not of a conductive glove, and, as indicated previously, does not prejudge the part of the hand coming into contact with the electrodes.

The operator's hand presents a different part in contact with each of the manual contact electrodes of the impedance-measuring interface and thus a contact impedance which may be different with each manual contact electrode. Each of these impedances also depends on the condition of the operator's hand, on its pressure on the electrodes, on the surface condition of the electrodes, the ambient conditions and of course on whether conductive gloves are worn.

While neglecting the impedance proper of the manual contact electrodes of the impedance-measuring interface and the wiring of the monitoring device, the contact impedances of the hand with each of the manual contact electrodes are in series with the first electrical impedance and the second electrical impedance in the second electric circuit. The values of the first and the second electrical impedance are known and set at the time of manufacturing the tool.

The measuring device of the impedance characteristic of a second circuit provides a value thereof, characterizing the sum of these impedances.

The first electric circuit which includes the first manual contact electrode, the first electric impedance and the conductive active component remains an open circuit when the operator touches the impedance-measuring interface. Now, when it is open, the total impedance of the first electric circuit is quasi-infinite, and therefore inevitably greater than the impedance of the second electric circuit.

However, the first electric circuit instead is closed when the operator simultaneously touches the electrically conductive active component and the first manual contact electrode. In the following description, it is considered, for the sake of simplification, that the operator touches the active component of the tool with a finger of the hand which does not touch the impedance-measuring interface. Any reference in the description below of the finger which touches the cutting element does not, however, prejudge the body part that may come into contact with the cutting element. The operation of the safety device of the invention is in fact identical during a contact of any other part of the operator's body, such as his face, forearm, leg or free hand, with the active component.

When the first electric circuit is closed by an inadvertent contact of the finger with the active component, associated with the contact of the hand with the first manual contact electrode of the impedance-measuring interface, the contact impedance of the hand with the first manual contact electrode, the impedance of the operator's body between his hand in contact with the first manual contact electrode and the finger touching the active component, the contact impedance of the finger with the active component, and the active component, find themselves connected in series in the first electric circuit.

Thus, the measuring device of an impedance characteristic of the first electric circuit provides a value of the sum of these impedances.

It is estimated that the impedance of the electrodes, wiring and that of the active component are negligible. The order of magnitude of the impedance of the operator's body, between his first hand brought to touch the impedance-measuring interface and the other hand brought to touch the active component, is incidentally known. It is in effect connected to the conductivity of the human body and presents a value less than ten thousand Ohms. On the other hand, the contact impedance of the hand with the manual contact electrodes in the first and in the second electric circuit as well as the contact impedance value between the finger and the active component may present great variability and are most often far above the impedance value of the operator's body, particularly in case of weak contact pressure and a skin of the hand having weak conductivity. Now, when the contact of the finger with the active component is close to being a risk of injury, the impedance value of contact of the finger with the active component becomes of the same order of magnitude or even less than the impedance value of the operator's body.

In the particular case where the active component is a cutting blade, the finger presents significant elasticity when the blade comes into contact with it and it is only with significant pressure that the blade can first cut the epidermis of the finger, causing a light injury before resulting in a severe injury as it pursues the cut. In the latter case, of a minor gash, such as a scrape on the epidermis, the value of the contact impedance between the active component, in this case the cutting blade and the subcutaneous parts of the body, is then significantly lower than the value of the impedance of the human body.

It is therefore deduced from this that the value of contact impedance at the active component in case of a serious contact is lower than the impedance value of the human body. Detection of an impedance of this order of magnitude allows identification with very high probability of the existence of a sudden and unintentional contact of the operator with the active component.

The same is not the case for the contact impedance of the operator's hand touching the impedance-measuring interface. This contact impedance may vary in more significant proportions. In fact, the simple measurement of the impedance characteristic of the first circuit alone does not makes it possible to identify the existence of a contact between the operator and the active component.

As soon as there is a minor injury on the active component, the contact impedance drops very rapidly to a value below the impedance of the human body and it drops further when there is a cut or deep wound to reach a very low value of a few hundred Ohms. The threshold impedance characteristic of such a contact, considering its overall low value and in any case estimated to be at an order of magnitude below the impedance of the human body, is largely masked by the possible variations of contact impedance between the operator's hand and the first manual contact electrode of the impedance-measuring interface. It is therefore not possible to characterize, in a sufficiently reliable manner, the existence of a contact risk at the active component by a simple measurement of the impedance characteristic of the first circuit.

It is therefore important to set a threshold value that makes it possible to establish the certainty of a contact between the operator's finger and the active component; and eliminating the variations in the contact characteristic between the operator's hand and the impedance-measuring interface.

This occurs, in accordance with the invention, by setting a threshold characteristic from the impedance characteristic of the second circuit. It is thus possible to compare the impedance of the first electric circuit with that of the second impedance, by freeing oneself of the influence of the contact impedance of the hand with the manual contact electrodes and particularly the contact impedance of the hand with the first manual contact electrode.

of the impedance-measuring interface and especially the contact impedance of the hand with the first manual contact electrode. In case of passing from a high impedance value of the first electric circuit towards a lower value than the threshold determined from the measure performed on the second electrical circuit, one then determines the existence of a very high risk of contact between the operator and the active component. The emergency stop device is then actuated.

Thus, and as mentioned previously, the threshold characteristic is set in accordance with the impedance characteristic of the second electrical circuit which serves as a reference circuit.

The impedance of the second electric circuit is equal to the sum of the first impedance, the second impedance and the contact impedances of the hand of the manual contact electrodes. The sum of the first impedance and the second impedance is preferably set at a value superior to the sum of an estimated impedance of the operator's body and an estimated contact impedance of the finger on the active component without a serious injury. For example, by expressing the impedances and the impedance characteristics in Ohms, the cumulative value of the first and the second impedance can be chosen to be greater than 20 k$\Omega$, and preferably greater than 100 k$\Omega$. The impedance of the body and the contact impedance of the finger are being estimated less than 10 k$\Omega$ each. The latter is all the weaker as the operator's hand touching the impedance-measuring interface is covered by a conductive glove. In such a case and in the absence of a contact of the finger with active component, the impedance of the first circuit is quasi-infinite and clearly greater than 20 k$\Omega$ or 100 k$\Omega$. Selecting a greater impedance value than the one resulting from an injury makes it possible to make the device even safer and to avoid an injury, including a minor injury.

When the finger comes into contact with the active component, the impedance of the operator's body and the contact of his finger on the active component, in the first electric circuit then becomes inferior to the impedance value of the sum of the first and the second electrical impedance of the second electric circuit. Thus, the characteristic of measured impedance of the first electric circuit becomes less than the threshold impedance characteristic or, at the very least crosses over the threshold characteristic. It should be recalled that the measured impedance characteristic can be expressed in the form of a voltage, current or Ohmic value. Depending on the case, the threshold value is exceeded when the impedance characteristic of the first circuit transitions from a value above the threshold characteristic to a value below the threshold characteristic (in case of voltage or of impedance) or by transitioning from a value less than the threshold characteristic to a value above the threshold characteristic (in case of current).

It should be noted that the values of the first impedance and the second electrical impedance are not necessarily above an estimated value of the sum of the impedance of the operator's body and the contact impedance of the finger. As a matter of fact, by choosing a threshold characteristic which is dependent on the impedance characteristic of the second circuit, and in particular proportionally to this impedance characteristic, it is possible to adjust the threshold characteristic with a coefficient of proportionality so as to optimize the safety of the tool.

According to preferred modes of implementation, one or several of the following characteristics may also be retained:
- the second electrical impedance presents an Ohmic value greater than 20 kΩ and preferably greater than 100 kΩ.
- the first electrical impedance presents an Ohmic value equal to the second electrical impedance.
- the first electrical impedance and the second electrical impedance are purely resistive.

In particular, the first electrical impedance may present an Ohmic value equal to the second electrical impedance and greater than 20 kΩ, and the first threshold characteristic may be chosen to be equal to the impedance characteristic of the second circuit.

The measurement of the impedance characteristic of the first electrical circuit and the measurement of the impedance characteristic of the second electric circuit are not necessarily concomitant but can be alternated dependent on the activations of the active component, and in particular on the cut activations of pruning shears. The fact of alternating the measurements makes it in effect possible to use a unique measuring device in order to measure the impedance characteristics of the two circuits.

In this case, the second electric circuit may include a switch; the switch being servo-driven by the operation control interface to open the second circuit at the time of operation start-up, and to close the second circuit in the absence of an operation startup; the measuring device being configured to measure an impedance characteristic of the first electric circuit when the second circuit is open and to measure an impedance characteristic of the second electric circuit when the second circuit is closed.

The term "switch" is understood here in the functional manner. It may be an electromechanical switch or a transistor switch passing from a conductive state to a blocked state and inversely.

The switch is considered to be servo-driven by the operation control interface when its opening is mechanically or electrically servo-driven by the actuation of the controller.

The operation request being in question here may particularly be a cutting control when the active component is an active cutting element.

In the case of an alternative measurement of the impedance characteristic of the first electric circuit and the impedance characteristic of the second electric circuit, the threshold value which depends on the impedance characteristic of the second electric circuit can be modified and updated at regular time intervals and/or at each new measurement of this impedance characteristic.

Also, the tool may include a storage memory of the threshold characteristic. The memory can be refreshed at each new measurement, and the stored value is provided to the comparator.

As mentioned previously, the measuring device does not necessarily measure an impedance of the first and of the second circuit, but at least an impedance characteristic, which is to say a characteristic linked to the impedance. In particular, the measuring device may include a source of electric current in series with the first and the second electric circuit and at least one of:
- a voltmeter connected in parallel to the terminals of the first impedance,
- an amperemeter, or an ohmmeter, connected in series with the first impedance.

In this case, the voltage registered by the voltmeter, the current intensity registered by the amperemeter or the impedance registered by the ohmmeter are usable as impedance characteristics.

The threshold characteristic may be set in a comparable manner as being a voltage, an impedance or a threshold current.

Closure of the first electric circuit by a contact of the finger on the active component triggers, if necessary an increase of the current going through the first circuit, a decrease of the voltage at the terminals of the first impedance or a decrease of the impedance characteristic, and thus a crossing of the threshold characteristic.

According to an improved mode of implementation, the source of electric power for the measuring device can be a source of alternating current. This is, for example, a source with an alternating frequency of 10 kHz. By using an alternating current source, it is possible to consider the implementation of the invention with a tool whose conductive active component would be coated with an insulating coating to especially prevent its corrosion. This may be the case, for example, when the blade of pruning shears is covered with a fine PTFE coating to facilitate its glide on the counter-blade during the cut. The contact of the finger with the active component would in this case be a primarily capacitive contact.

The following description concerns another possibility of configuration of the monitoring device and utilization of the impedance-measuring interface. According to this other possibility of configuration, the monitoring device may include:
- An electric monitoring circuit including the first manual contact electrode of the impedance-measuring interface and the active component, the electric monitoring is capable of closing upon a simultaneous contact of the operator with said first manual contact electrode and the active component,
- an electric generator of a monitoring current in the first electric circuit,
- a measuring device of a monitoring voltage between the active component and the second manual contact electrode,
- a comparator of at least one monitoring electrical characteristic dependent on the monitoring voltage and an electrical threshold characteristic dependent on an impedance value which increases the human body conduction impedance value; the comparator being connected to the emergency stop device to cause an emergency stop when the electrical monitoring characteristic crosses the threshold electrical characteristic.

The measuring device of a monitoring voltage between the active component and the second manual contact electrode of the impedance-measuring interface may be, preferably a high impedance measuring device such as a voltmeter. Its internal impedance is several orders of magnitude higher than the impedances involved in the electric monitoring circuit, so as not to interfere with a current flowing in the electric monitoring circuit. This is, for example, an internal impedance greater than 10KΩ. The monitoring voltage is measured relative to the potential of the active component which corresponds, preferably, to the ground of the tool. It can also be measured or determined relative to a constant potential, relative to the ground or relative to the active component.

The monitoring electrical characteristic may be a characteristic that can be expressed in the form of a voltage, a current, an impedance value or even a conductance value. It is based on the monitoring voltage in accordance with the Ohm's law.

The same is true for the threshold characteristic which is based on the human body conduction impedance and in particular a value which increase the human body impedance value. It can also be established in the form of a voltage, a current, an impedance value or a conductance value in application of Ohm's law and an impedance value of the electric circuit.

Different forms of expression of the monitoring electrical characteristic and the threshold electrical characteristic are explained in the description below.

The electric monitoring circuit includes, as previously mentioned, the first manual contact electrode, and the electrically conductive active component. It is closed when the operator touches at the same time the first manual contact electrode of the impedance-measuring interface of the tool and the active component.

For the sake of simplification, it is always considered that the operator touches the first manual contact electrode of the impedance-measuring interface with one of his hands, and that he touches the active component with a finger of his other hand which then is at risk of being injured. This choice however does not imply any limitation with respect to the part of the body that touches the active component.

Thus, when the operator simultaneously touches the first manual contact electrode of the impedance-measuring interface and the active component, a certain number of impedances find themselves in series in the measuring circuit between the first manual contact electrode and the active component. These are:

contact impedance between the hand and the first manual contact electrode, marked $Z_{M1}$, impedance of the operator's body, between the hand touching the first manual contact electrode and the finger of the other hand, marked $Z_C$, and the contact impedance between the finger and the active component, marked $Z_D$.

Furthermore, in the particular case where the tool is a pruning shear, one notes $Z_V$, the sum of impedance of the vegetation, for example of vine tendrils, and the contact impedance of the finger or more generally of the hand, on the vegetation or an object held by the free hand of the operator and cut by the active component. The object held may be, if applicable, a trellis wire. For other tools the value $Z_V$ characterizes the impedance of the cut or machined material associated with the contact of the finger with this material, in the hypothesis where this material is touched by the operator's free hand.

By ignoring the proper impedance values of the first manual contact electrode and the active component, the total impedance marked $Z_T$ of the electric monitoring circuit can take three values:

An infinite value $Z_T=\infty$, when the active component has not been touched,

A value $Z_T=Z_{M1}+Z_C+Z_D$ when the finger touches the active component,

A value $Z_T=Z_{M1}+Z_C+Z_V$ when a material held by the free hand touches the active component.

The order of magnitude of the impedance value $Z_C$ of the operator's body, between his first hand touching the impedance-measuring interface and his finger of the other hand likely to touch the active component, can easily be evaluated. It is the conductivity of the human body whose impedance has a value less than ten thousand Ohms. The value of the contact impedance $Z_{M1}$ of the hand with the first manual contact electrode as well as the value of contact impedance $Z_D$ between the finger and the active component, or the impedance $Z_V$ including the intermediary impedance of a material in contact with the active component may present great variability and are most often far more higher than the impedance value of the operator's body, especially in case of weak contact pressure with a part of the skin of the hand having weak conductivity.

In the following description, reference is only made to the direct contact of the finger with the active component. In effect, the situation of contact of the finger with an intermediary material does not create a risk for the operator. It may possibly trigger the emergency stop device when an impedance value $Z_V$ is close to $Z_D$, i.e. when the intermediary material is a good electric conductor.

However, when the contact of the finger with the active component is close to risking an injury, the value of the contact impedance of the finger $Z_D$, can be evaluated as being of the same order of magnitude or even less than the impedance value $Z_C$ of the operator's body. This can be referred to in the preceding description.

Here again, it is estimated that the contact impedance value at the active component in case of a serious contact is less than the impedance value of the human body. Detection of an impedance in the order of magnitude of the impedance of the human body allows identification with a high degree of probability of an instant and not intended contact of the operator with the active component.

The same is not the case for the contact impedance $Z_{M1}$ between the operator's hand and the first manual contact electrode, the value of which can vary in more significant proportions, and actually mask the occurrence of a contact between the operator's finger and the active component.

The measuring device of the invention makes it possible to dispense with the contact impedance $Z_{M1}$ between the operator's hand and the first manual contact electrode. This occurs by measuring a voltage on the second manual contact electrode of the impedance-measuring interface. The second manual contact electrode of the impedance-measuring interface is connected to the first manual contact electrode through the intermediary of the operator's hand which touches the impedance-measuring interface. The manual contact electrodes are thus connected by two potentially high impedances in series. It is the contact impedance $Z_{M1}$ of the hand with the first manual contact electrode and of an impedance $Z_{M2}$ of contact of the hand with the second manual contact electrode of the impedance-measuring interface. Thus, it is also considered that the second manual contact electrode is connected to the impedance of the operator's body through the impedance of hand contact with the second manual contact electrode. Because of the high internal impedance of the voltage $V_{E2}$ measuring device the voltage measured on the second manual contact electrode, or more precisely the potential difference between this electrode and the ground of the tool is essentially equal to a potential difference $V_C$ which would be measured in an internal imaginary point of the operator's hand marked C and the active component connected to the ground of the tool. In effect, a zero or almost zero current circulates between this imaginary internal point and the second manual contact electrode of the impedance-measuring interface ensuring the quasi-equality of the potentials $V_{E2}$ and $V_C$, these two voltages can be considered as constituting the monitoring voltage.

The function of the electric generator of a monitoring current is to circulate in the monitoring circuit a monitoring current $I_S$, when the monitoring circuit is closed, i.e. during a contact, direct or indirect, of the operator with the active component.

The electric generator may include, for example, a current source. It may also include a voltage source. The current source or the voltage source may be connected in series in the monitoring circuit.

The electric generator of the monitoring current may have an independent power supply, for example, an electric battery. It may also be supplied with energy from an electric power source, for example, a power supply battery of a tool, provided that the tool is equipped with an electric drive motor.

When the electric generator includes a current source, the intensity of the current when the circuit is closed, is known. It then corresponds to the intensity of the monitoring current $I_S$.

The tool may also include, in series in the electric circuit, an electric adjustment impedance presenting a predetermined and known impedance value $Z_1$ as well as a measuring device of a voltage $V_1$ at the terminals of the electric adjustment impedance. The measurement of this voltage makes it also possible to know the intensity of the monitoring current $I_S$. In effect, the monitoring current $I_S$ is equal to the ratio of the voltage measured at the terminals of the electric adjustment impedance on the value of electric adjustment impedance:

$$I_S = V_1/Z_1$$

The selection of the value of adjustment impedance $Z_1$, is likely to influence the intensity of the current flowing in the monitoring circuit. It is however not critical, its function being essentially to determine the intensity of the monitoring current. For example, the value of the adjustment impedance can be chosen between 1Ω and 200 KΩ.

The measuring device is, for example, a voltmeter, and in particular a voltmeter integrated in an electronic card which also includes the comparator.

It is thus possible to know the cumulated impedance Z of the operator's body based on the measurement of $V_{E2}$ and the monitoring current Is flowing in the electric monitoring circuit.

One has:

$$Z = Z_C + Z_D \text{ and}$$

$$V_{E2} = I_S \times Z.$$

Which is:

$$Z = V_{E2}/I_S$$

This impedance can be compared to an impedance value of threshold impedance $Z_{threshold}$ which increases the impedance value $Z_C$ of the human body, and preferably increasing the impedance value $Z_C$ of the human body by a factor of 3. In particular, the value which increases the impedance of the human body can be chosen to be equal to 20 kΩ and preferably greater than 100 kΩ.

The monitoring electrical characteristic may be one of the following:

a voltage equal to the monitoring voltage, or dependent on the monitoring voltage, the threshold electrical characteristic being equal to the product of the impedance value which increases the human body conduction impedance value and the monitoring current.

an impedance value dependent on the monitoring voltage and the monitoring current, the threshold characteristic being an impedance value dependent on the impedance value which increases the human body conduction impedance value, a ratio of the monitoring voltage to the monitoring current; the threshold characteristic being equal to the impedance value which increases the human body conduction impedance value.

As indicated above, the monitoring electrical characteristic can be a voltage dependent on the monitoring voltage, and the threshold electrical characteristic may be a threshold voltage dependent on the impedance value $Z_{threshold}$ which increases the human body conduction impedance value and the monitoring current.

In a particular case where the monitoring electrical characteristic is equal to the monitoring voltage $V_{E2}$, and the threshold electrical characteristic may be equal to a voltage $V_{threshold}$ equal to the product of the impedance value which increases the human body conduction impedance value and the monitoring current.

In this case $V_{E2}$ and $V_{threshold}$ are compared to each other. where $V_{threshold} = Z_{threshold} \times I_S$ When $V_{E2} > V_{threshold}$, the operation of the tool is normal.
When $V_{E2} < V_{threshold}$ or $V_{E2} = V_{threshold}$, the emergency stop device is actuated.

When the monitoring electrical characteristic is an impedance value dependent on the monitoring voltage and the monitoring current, the threshold characteristic may be an impedance value dependent on the impedance value $Z_{threshold}$, which increases the human body conduction impedance value.

In particular, the monitoring electrical characteristic may be equal to an impedance Z equal to the ratio of the monitoring voltage, and the monitoring current, and the threshold characteristic may be equal to the impedance value $Z_{threshold}$, which increases the human body conduction impedance value.

In this case, when $Z > Z_{threshold}$, the operation of the tool is normal.

However, if $Z < Z_{threshold}$ or $Z = Z_{threshold}$, the emergency stop device is actuated.

Other characteristics of monitoring and threshold such as fine-tuned functions of the aforementioned variables may also be retained; it is still possible to compare conductance values.

The comparison between the impedance Z and the impedance $Z_{threshold}$, or as mentioned previously, the comparison of the monitoring voltage $V_{E2}$ with a voltage $V_{threshold}$, or also, more generally, the comparison of another monitoring electrical characteristic, dependent on the monitoring voltage, with a threshold electrical characteristic, dependent on an impedance which increases the human body impedance, is performed by the comparator.

To this effect, the value $Z_{threshold}$, the value $V_{threshold}$, or more generally the value of the threshold electrical characteristic dependent on an impedance which increases the human body impedance, can be stored in a memory connected to the comparator. The threshold values contained in the memory may be set during the manufacture of the tool. Access to the memory can also be provided in order to modify the threshold values in order to modify, if needed, the sensitivity of the actuation of the emergency stop device.

When the electric generator includes a current source, the latter can be connected in parallel to the adjustment impedance, connected in series in the electric monitoring circuit. As mentioned previously, Ohm's law can then be used to determine the Is value of the current flowing in the monitoring circuit.

The electric generator may be an alternating current generator or a direct current generator. An alternating current generator presents, for example, an operating frequency of 10 kHz. As indicated previously, the use of an alternating monitoring current allows the device to function when the active, conductive component is covered with an electrically insulating coating.

Additionally, the tool may include a ground impedance, of a value exceeding by several orders of magnitude the impedance value which increases the human body impedance value, the ground impedance connecting electrically the second manual contact electrode to the active component. In this case, the tool can be configured to also cause either an emergency stop or a deactivation when the monitoring voltage measured by the measuring device is zero. The ground impedance prevents a floating potential of the second manual contact electrode. Its value is very high, for example, several million Ohms, so that no significant current is introduced into the second manual contact electrode, and thus does not affect the measurement of the monitoring voltage. Furthermore, because of the ground impedance, it is possible, in the absence of contact of the hand simultaneously on the first and the second manual contact electrode, to have a monitoring voltage of zero at the second electrode. Measurement of a zero tension $V_{E2}$ enables, as indicated above, activation of the emergency stop device, or a simple deactivation to inhibit the use of the tool.

It should be noted that the operator may, as needed, have to wear electrically conductive gloves, especially to protect himself from the cold. It is estimated in this case that the contact of the hand with the glove does not generate significant variations of impedance and in particular greater than the variations of a direct contact of the hand with the manual contact electrode(s) of the impedance-measuring interface.

Other characteristics and advantages of the invention will become clear from the following description in reference to the figures of the drawings. This description is given on an illustrative and non-limiting basis.

BRIEF DESCRIPTION OF THE FIGURES

FIGS. 5A, 58 and 5C are respectively a perspective, a side view and a section view along a plane A-A of a pushbutton forming a controller of a control device according to the invention.

Figure 1:
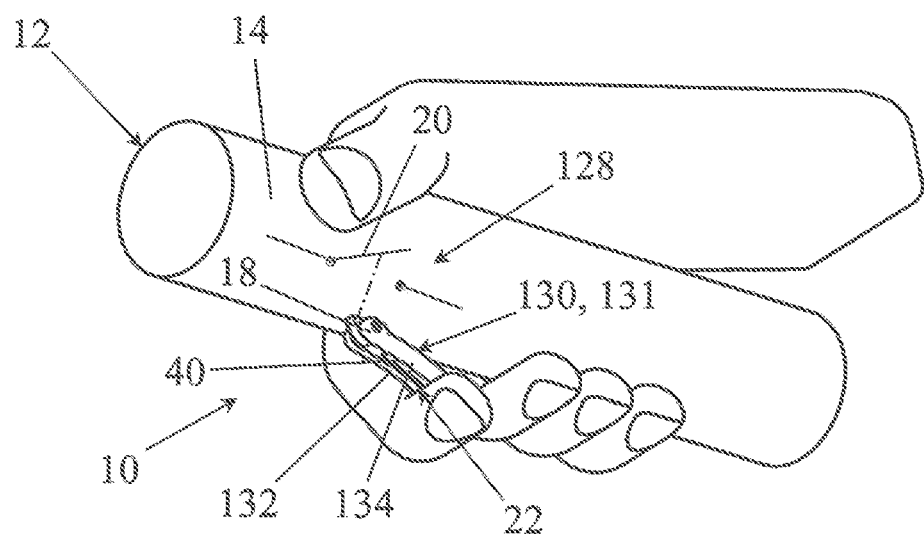
FIGS. 1 and 2 are simplified representations of a control device in accordance with the invention with a controller in the off-position.

The figures are drawn in free scale.

DETAILED DESCRIPTION OF IMPLEMENTATIONS OF THE INVENTION

In the following description identical, similar or equivalent parts of the various figures are identified with the same reference marks so as to make it possible to refer from one figure to another.

FIGS. 1 to 4 show a control device 10 for a tool 12 including an active component, of which only a handle 14 is shown. The handle is held by an operator's hand. The control device includes an operation control interface 128.

The operation control interface 128 includes a manually actuated controller 130 and one or several electric components 20 actuated by the controller to deliver or modify a control signal to actuate the active component.

On FIGS. 1 to 4, the electrical components 20 of the operation control interface are symbolized by a simple switch without prejudging the configuration of this controller which may also include a speed controller, an optical interface or other components for forming or modifying a control signal.

In the case of an electric tool, the control signal may be directed towards an electric power supply card for an electric drive motor of the active component, governing the electric power supply to the motor as a function of the control signal.

In the case of a tool with a heat engine, the operation control interface may be an electric or mechanic control interface.

Figure 3:
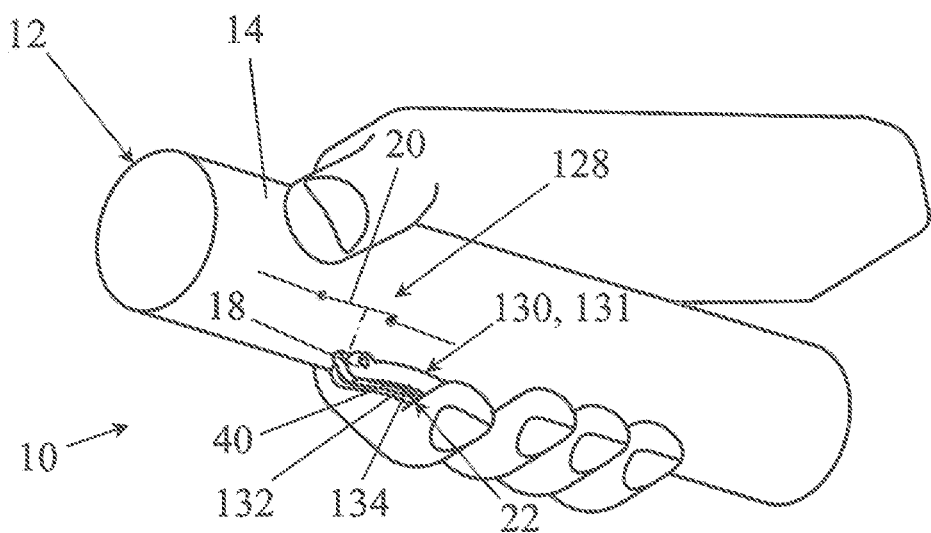
FIGS. 3 and 4 are representations of the devices of FIGS. 1 and 2, with a controller in operating or working position.

FIGS. 1 and 3 show a controller 130 including a lever trigger 18 actuated by a finger of the operator's hand grasping the handle. On FIG. 1, the finger touches a manual bearing surface 22 of the controller 130 but without pushing the lever trigger in. It is an indexed off-position of the lever trigger in which the tool is at off or standby position.

On FIG. 3, the finger touching the manual bearing surface 22 exerts pressure on this manual bearing surface. It makes the lever trigger pivot and the control interface 128 emits or modifies a signal putting the tool in operation. The position of the controller 130 of FIG. 3 is designated by the operating position.

Figure 2:
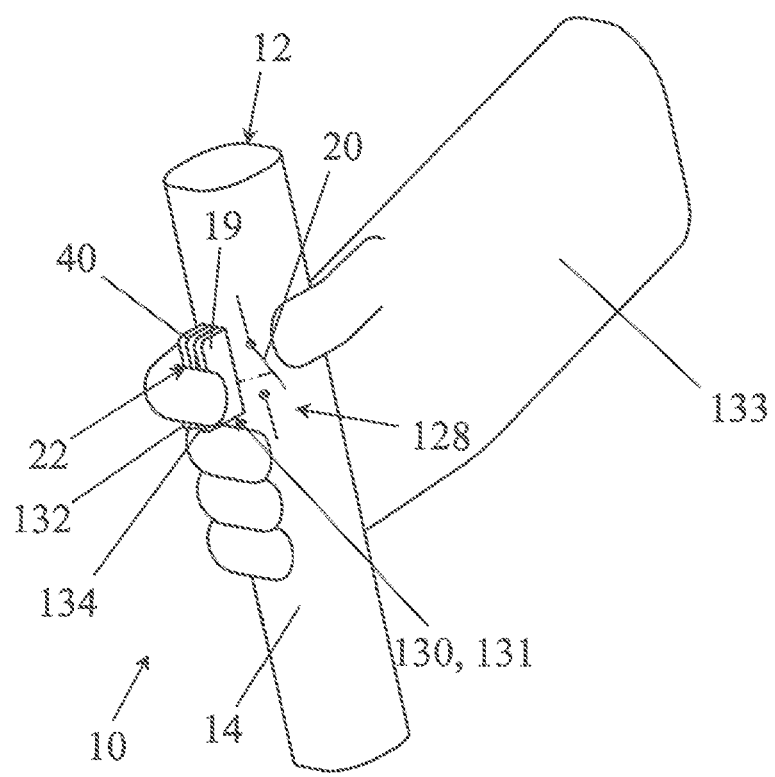
Figure 4:
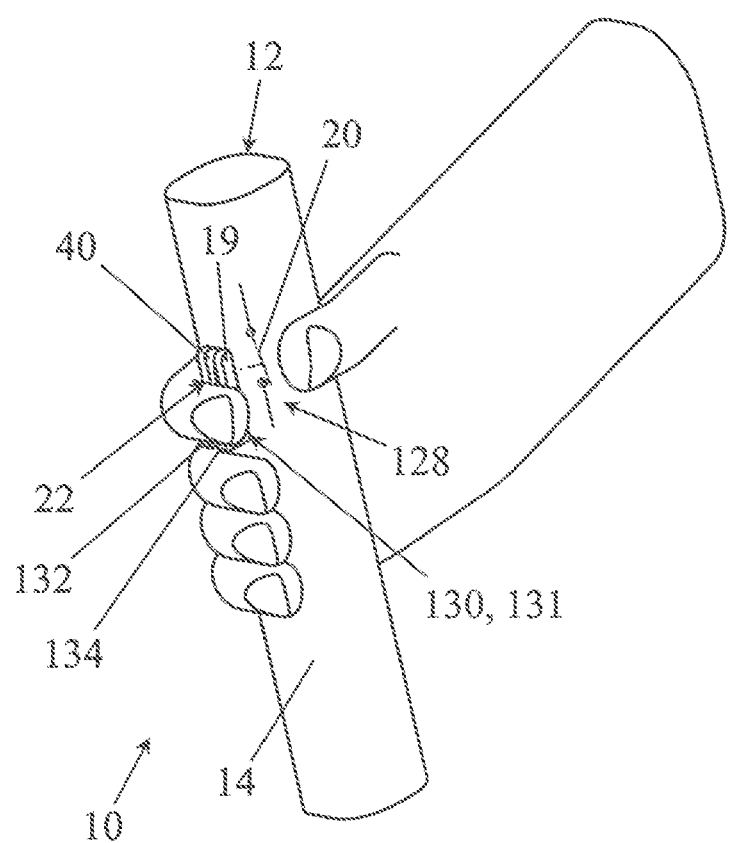

Likewise FIGS. 2 and 4 show a controller 130 including a pushbutton 19 also operated by a finger of the hand grasping the handle. The finger is shown in contact with a manual bearing surface 22 of the controller. FIG. 2 corresponds to the pushbutton in an off position in which the pushbutton protrudes from the shaft 14. FIG. 4 corresponds to the controller in an operating position: the pushbutton 19 is pushed into the handle 14 by the pressure exerted by the finger in contact with the manual bearing surface 22.

The pushbutton 19 or the lever trigger 18 constitute the manually operated controller 130 and are part of the operation control interface 128 but also constitute an impedance-measuring interface 131 described below.

It can be seen that the operator's hand on FIG. 2 is covered by an electrically conductive glove 133. This glove is part of, or at least associated with, the operation control interface. It improves the contact of the hand or the finger with the impedance-measuring interface 131. It can be noted that only the part of the glove in contact with the impedance-measuring interface may be covered with a conductive coating. However, the conductive coating is not only on the outside of the glove to come into contact with the impedance-measuring interface, it is also on the inside of the glove, so as to also come into contact with the operator's skin. The exterior conductive coating and the interior conductive coating are thus electrically connected to put the operator's hand into electric contact with the impedance-measuring interface. In order to avoid an imperfect contact between the interior conductive coating of the glove and the operator's skin; the interior coating is preferably not limited to just the part facing the impedance-measuring interface. It is preferable that the glove be conductive over a large surface in contact with the hand to ensure a weak contact impedance between the operator's hand and the glove, thereby ensuring a weak contact impedance between the hand and the impedance-measuring interface.

The impedance-measuring interface 131 includes essentially a first manual contact electrode 132 and a second manual contact electrode 134. The manual contact electrodes of the impedance-measuring interface 131 appear better on FIGS. 5A and 5C as well as on FIGS. 6A and 6C.

Figure 5A:
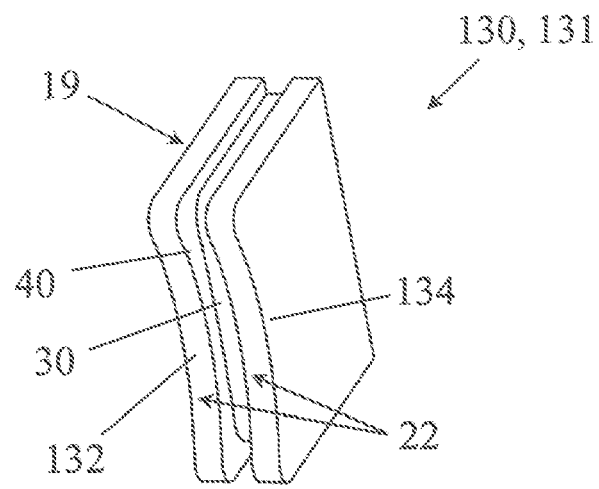

FIG. 5A is a perspective of a possibility of special implementation of the controller 130 with manual actuation and more precisely of a pushbutton 19 which constitutes the part of the controller protruding from the shaft of the tool.

Figure 5B:
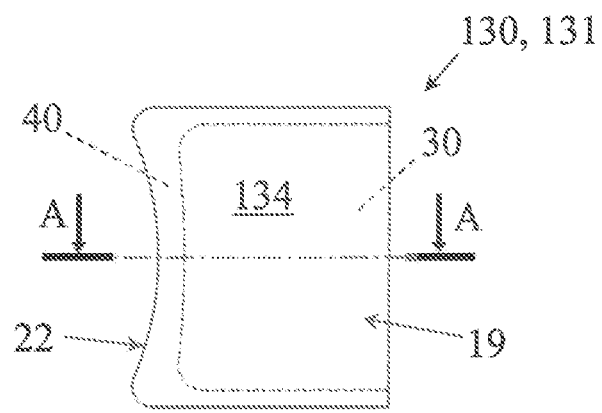
Figure 5C:
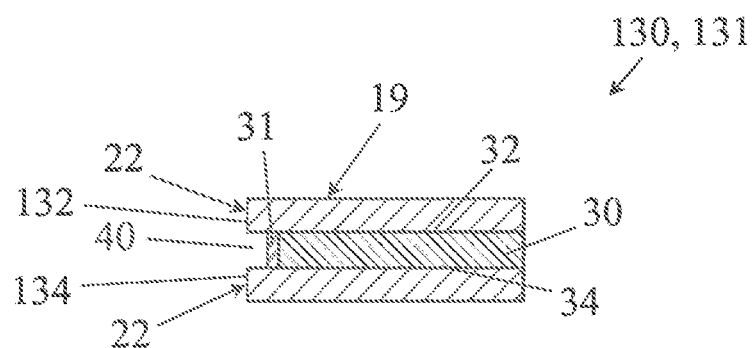

FIG. 5C is a section of the pushbutton along a section A-A indicated on FIG. 5B representing a side view of the pushbutton. It shows that the pushbutton presents an electrically insulating central body 30, for example made of plastic material; the sides 32, 34 of which receive metallic fittings forming the manual contact electrodes 132, 134. The central body 30 may also include or constitute a separator. It includes in this case, a moisture-absorbing material such as porous ceramic, or a water repellent material such as PTFE or PVDF, a Teflon-type coating or a closed cell foam of a water repellent material. FIG. 5C shows the central body 30 covered by such a separator 31 made of Teflon.

Reference 22 indicates the bearing surface of the pushbutton 19. As FIGS. 5A, 5B and 5C show, the central body 30 of the pushbutton is retracted relative to the manual contact electrodes so as to make a recessed relief 40 between the manual contact electrodes. The recessed relief extends longitudinally on the pushbutton and extends itself on the manual bearing surface.

Returning to FIGS. 1 to 4, it can be noted when activating the controller 130, the operator's finger extends perpendicularly to the recessed relief 40 so as to connect the manual contact electrodes to each other.

Figure 6A:
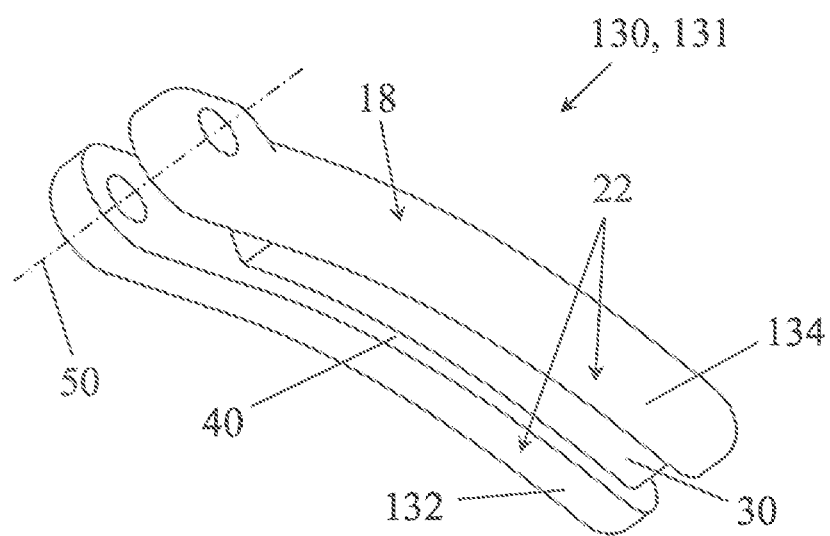
FIGS. 6A, 6B and 6C are respectively a perspective, a side view and a section view along a plane B-B of a lever trigger forming a controller of a control device according to the invention.
Figure 6B:
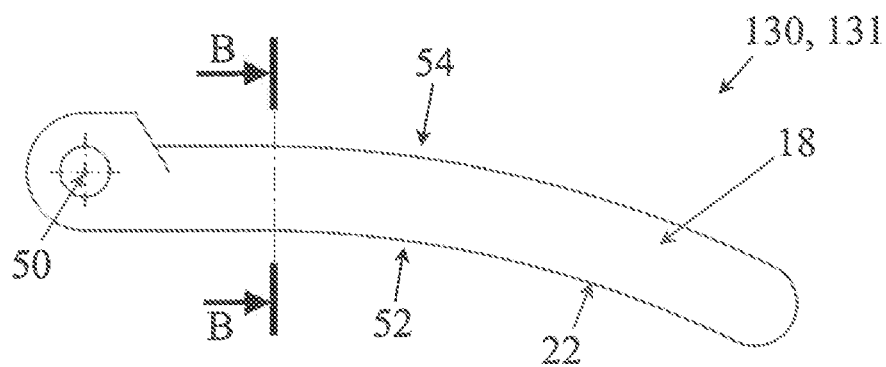

FIGS. 6A, 6B and 60 show another possibility of manufacturing the controller 130 with manual activation in which the controller includes a lever trigger 18. The lever 18 presents a pivoting axis 50 and is mounted on a pivot of the tool, not shown. It is noted here that the pivot of the tool is made of a plastic material or an insulating ceramic, so as not to electrically connect the manual contact electrodes. The pivot may also be of a metallic material. In this case, however, the electrodes are configured not to come into contact with the pivot, in order not to be electrically connected by the pivot.

Figure 6C:
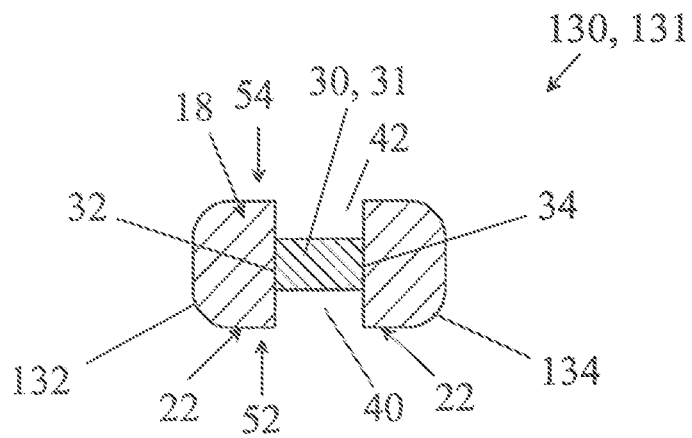

FIGS. 6A and 6C show that the lever 18 includes a central body 30, of which the opposing sides receive metallic fittings forming the manual contact electrodes 132, 134. The central body is made of an electrically insulating material, for example, a plastic material. A first recessed relief 40 presents itself in the form of a longitudinal groove. It runs longitudinally along a first face 52 of the lever 18, forming the manual bearing surface 22. The first recessed relief 40 extends between the manual contact electrodes 132, 134 and parallel to the manual contact electrodes. It is formed by a recess of the central body 30 relative to the manual bearing surface 22.

FIG. 6C shows a section of the lever 18 along a section B-B indicated on FIG. 6B, representing a side view of the lever. As FIG. 6C shows a second recessed relief 42 extends similarly on a second face 54 opposite to the first face 52, by also running along the lever in a longitudinal manner between the manual contact electrodes. In the example of FIG. 6C, the central body 30 is entirely made of an electrically insulating, moisture-absorbing material or of a water repellent electrically insulating material. It thus constitutes a separator 31 in the sense of the invention.

Figure 7:
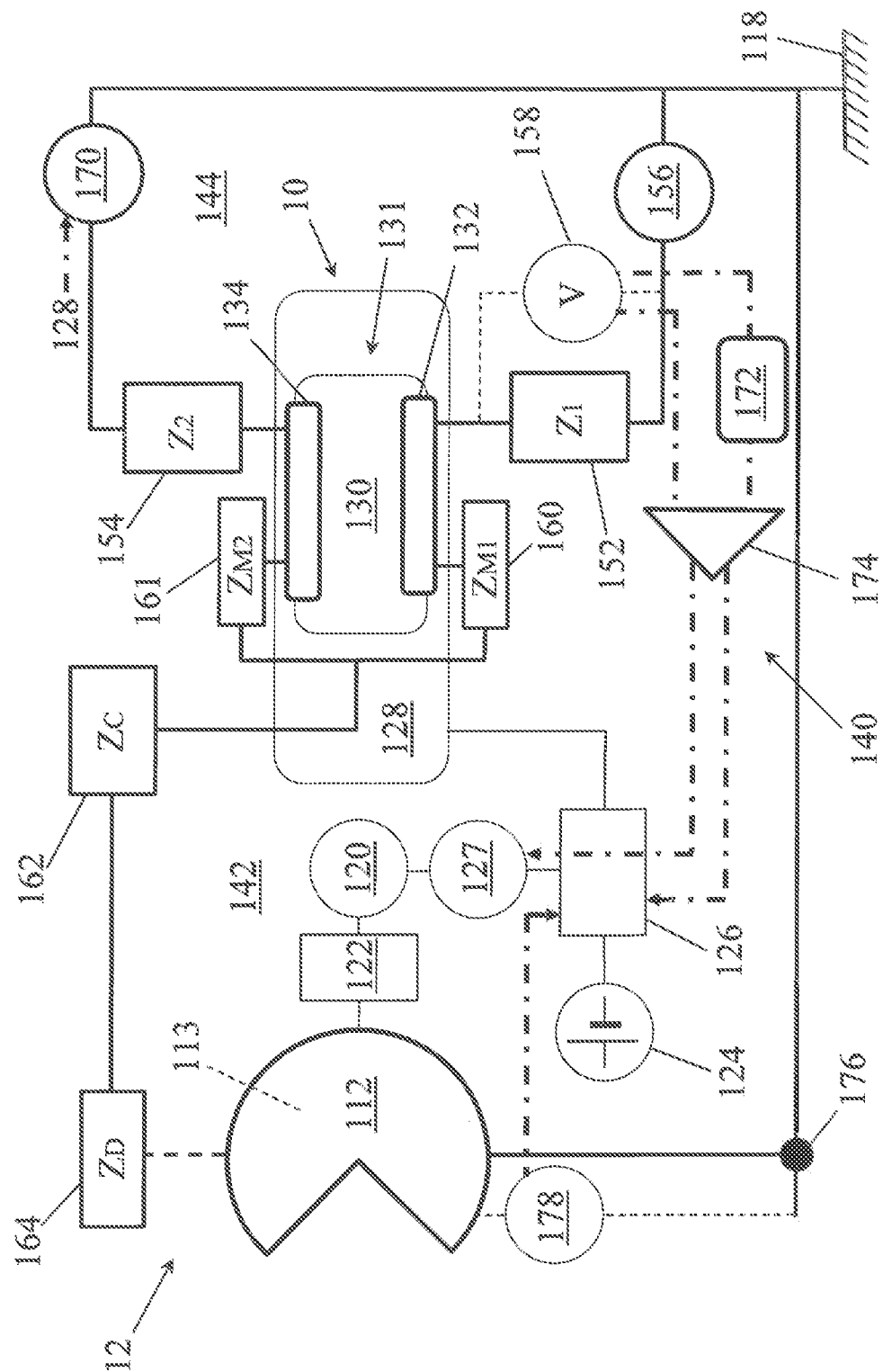
FIG. 7 is a functional schematic representation illustrating a possibility of production of a safety power tool in accordance with the invention and using the control device.

FIG. 7 shows a schematic diagram of a safety power tool 12 provided with an emergency stop device and using a control device as described previously. The tool 12 is provided with an active component 112. It is for example an electric pruning shear whose active component is a cutting element formed by a mobile blade that may be capable of closing on a hook, so as to cut off a branch or a twig caught between the blade and the hook. The blade and the hook are metallic and electrically conductive parts. They may possibly be covered by an electrically insulating polymer coating 113 to protect them against corrosion and to facilitate their slide against each other.

The active component 112 is electrically connected to the ground 118 of the tool constituting a reference potential.

The tool 12 also includes an electric drive motor 120 mechanically connected to the active component 112, through a transmission mechanism 122.

The electric motor 120 is associated with an electric power supply 124 and an electronic control card 126 of the motor. The electronic control card 126 receives signals from the operation control interface 128 of the control device 10. The operation control interface includes the manually actuated controller 130 shown schematically.

An emergency stop device 140 of the tool's electric drive motor 120 is governed by two electric circuits 142, 144. The electric circuits 142, 144 include components of the tool, in particular the active component 112, but may also include parts of a human body using the tool.

The first electric circuit 142 includes, in series, a component forming a first electrical impedance 152, a first manual contact electrode 132 and the active component 112.

The first electrical impedance 152, whose value is noted $Z_1$, may be a simple electronic component such as an electric resistance.

Its value is preferably defined to be equal or greater than 100 kΩ.

The first electric circuit 142 is normally an open circuit having consequently a quasi-infinite global impedance.

When an operator touches the impedance-measuring interface 131 of the control device 10, his hand comes into contact with the manual contact electrodes 132, 134 and hence with the first manual contact electrode 132. The first electric circuit 142 remains open.

Whereas, when the operator also touches the active component 112, for example with a finger of his free hand, he closes the first electric circuit 142. In this case, the first electrical impedance 152 finds itself successively in series with the first manual contact electrode 132, a contact impedance 160 of the operator's hand or finger with the first manual contact electrode 132, an impedance 162 of the operator's body, a contact impedance 164 of the finger with the active component 112, and finally the active component 112 itself. It can be noted here that, in the case where the tool 12 is a pruning shear, the circuit would also be closed if the operator indirectly touched the active component 112, in this case a blade, through the intermediary of a conductor such as a branch, a vine tendril or even a trellis wire in the process of being cut. This situation only adds a supplemental impedance in the circuit and does not jeopardize the operation. For the sake of simplification, only the case of a direct contact of the finger with the active component will be dealt with below.

The values of the contact impedance 160 of the hand or the finger touching the impedance-measuring interface, of the impedance 162 of the body and of the contact impedance 164 of the finger with the active component are noted respectively $Z_{M1}$, $Z_C$ and $Z_D$.

Thus, when the first circuit is closed a total impedance $Z_{142}$ is such that:

$$Z_{142}=Z_1+Z_{M1}+Z_C+Z_D$$

The impedance of wiring and the cutting element are ignored here.

A measuring device of an impedance characteristic of the first electric circuit is provided. In the example of implementation of FIG. 7, it includes an electric generator 156 in the form of an alternating current source in series with the first circuit 142, and a voltmeter 158 connected in parallel with the first impedance 152. The value of voltage measured by the voltmeter is, in this case, the impedance characteristic of the first circuit, in the sense of the invention.

A second electric circuit 144 includes the first electrical impedance 152, the first manual contact electrode 132, the second manual contact electrode 134 and a second electrical impedance 154.

Just like the first electrical impedance, the second electrical impedance may be formed by an electronic component such as a simple resistance of a defined value, preferably above 100 kΩ. Its impedance value whether real or complex, is marked $Z_2$.

The second electric circuit is also an open circuit when the operator does not touch the impedance-measuring interface 131 of the tool 12. The manual contact electrodes 132, 134 are in effect electrically insulated from each other.

However, when the operator puts a finger or his hand on the impedance-measuring interface 131 of the controller 130, his finger or his hand will electrically connect the first and the second manual contact electrodes 132, 134 of the impedance-measuring interface 131. A contact impedance 160 of the operator's hand or finger with the first manual contact electrode 132 of value $Z_{M1}$, and a contact impedance 161, of a value noted as $Z_{M2}$ of the operator's hand or finger with the second manual contact electrode 134 of the impedance-measuring interface 131 then are added in series in the second circuit.

In this case, the impedance $Z_{144}$ of the second electrical circuit 144 is such that:

$$Z_{144}=Z_1+Z_2+M_1+M_2$$

Now, the values $Z_{M1}$ and $Z_{M2}$ are coming from contacts of the same kind and their variations are therefore similar. The same is the case for the value $Z_D$ in the first circuit and each circuit thus includes two values of contact impedance of the same kind. A comparison of $Z_{142}$ and $Z_{144}$ thus makes it possible to eliminate the variations of the contact impedances with the manual contact electrodes, and to measure the occurrence of a contact of the operator's finger with the active component 112 by evaluating $Z_C$ and $Z_D$ against $Z_2$ and $Z_{M2}$.

A measuring device is also provided to establish an impedance characteristic of the second electric circuit. In the example of implementation described, this the electric generator 156 and the voltmeter 158 already mentioned, and also used in connection with the first electric circuit 142. The voltage measured at the terminals of the first electrical impedance 152 is a value of the characteristic of the second electrical circuit 144.

Since a single measuring device is provided to measure the impedance characteristics of the first and second electric circuit 142, 144, an alternate measure is provided.

For this purpose, the second electrical circuit 144 includes a switch 170 for opening or closing the second electric circuit. The switch 170 may be of the electromechanical type or, preferably, an electronic transistor switch.

The switch 170 is servo-driven by the operation control interface 128 so as to be closed in the off-position and to be open in the operating position.

In the absence of an operating command, the risk of the operator being cut by the active component is low or non-existent. The first circuit is open, assuming that the operator does not touch the active component 112. The switch 170 of the second circuit is then closed and enables a measurement of the characteristic of the second electric circuit 144. An electrical characteristic of singular value can however be measured in the case where the operator does not simultaneously touch the two manual contact electrodes and when the circuit 144 is open in spite of the switch 170 being closed.

When the operator activates the controller 130, for example, by depressing a pushbutton or a lever trigger, the switch 170 of the second electric circuit 144 is open so as to enable a measurement of the impedance characteristic of the first electric circuit 142.

At each measurement of the impedance characteristic of the second electric circuit 144, the value of this impedance characteristic, or a value proportional to the impedance characteristic is updated and saved in a memory 172 until a next measurement. The measurements of the impedance characteristic of the second electric circuit 144 and the update of the memory 172 can be made at each closing of the switch 170 of the second electric circuit or at predetermined intervals when said switch remains closed.

The stored value constitutes a threshold characteristic.

The memory 172 is connected to an input of a comparator 174 so as to supply the threshold characteristic as a reference value.

A second input of the comparator 174 receives the impedance characteristic of the first electric circuit at the time of an operation control, i.e. when the switch 170 of the second electric circuit 144 is open.

The impedance characteristic of the first electrical circuit is thus compared to the threshold value.

An output of the comparator 174 is connected to the electronic control card 126 of the drive motor 120. If the threshold value is deviated from by higher or lower value, according to the impedance characteristic selected, the comparator emits a stop signal in the direction of the electronic control card of the drive motor. The stop signal is used by the electronic card to trigger an emergency stop of the drive motor and the cutting operation. The emergency stop may include, for example, an opening of a circuit of electric power supply to the drive motor, or a servo-drive of the motor to block the movement of the cutting element. Additionally, the comparator may also emit such a stop signal in case of the presence of a singular value in the memory 172, signifying a simultaneous contact default of the two manual contact electrodes of the impedance-measuring interface 131. Such a situation is in fact likely to compromise a detection of an unintentional contact of the operator with the active component.

The electronic control card 126 of the drive motor is thus part of the emergency stop device 140. The emergency stop device may also include a switch 127 for opening a circuit of an electric power supply of the drive motor.

In a particularly simple implementation of the cutting tool, the first electric impedance 152 and the second electric impedance 154 may be set at a same value $Z_1=Z_2$ in the order of 100 kΩ or 200 kΩ. These values are clearly much higher than an estimated impedance of the human body and to an estimated impedance of contact of the finger with the cutting element.

An impedance of the human body is estimated to be less than 10 kΩ. The same is true for the impedance of the finger with the active component, which is estimated to be less than 10 kΩ, and rather in an order of magnitude of 1 kΩ, especially following a developing injury.

In this example of implementation, the retained threshold characteristic $Z_{threshold}$ is directly the measured impedance of the second circuit, which is:

$$Z_{threshold} = Z_{144} = Z_1 + Z_2 + Z_{M1} + Z_{M2}$$

When the first electronic [sic] circuit is open, its impedance Zi is quasi-infinite and $Z_{142} > Z_{threshold}$.

However, when the operator touches simultaneously the impedance-measuring interface 131 and the active component 112, the impedance of the first electric circuit becomes:

$$Z_{142} = Z_1 + Z_{M1} + Z_C + Z_D$$

The comparator 174 thus compares:

$$Z_1 + Z_{M1} + Z_C + Z_D \text{ and } Z_1 + Z_{M1} + Z_{M2} + Z_2$$

By eliminating $Z_1$ and $Z_{M1}$ in the two total impedances, this amounts to comparing the sum of the impedance of the operator's body and of the contact impedance with the active component to the electrical impedance $Z_2$ increased by a value $Z_{M2}$.

Thus, as $Z_2$ is chosen to be greater than the estimated values of $Z_C$ and $Z_D$, the sum of $Z_{M2}+Z_2$ is greater than the sum of $Z_C$ and $Z_D$ and one gets: $Z_{142} < Z_{threshold}$.

The threshold has been exceeded and the comparator delivers an emergency stop signal.

The reference 176 designates a control electrode electrically connected to the active component 112. It is provided to enable a test of the emergency stop without touching the active component. In fact, it suffices for the operator to touch the impedance-measuring interface and simultaneously touches with his free hand the control electrode 176 to cause an emergency stop. The electronic control card 126 can possibly be configured to request such a periodic control operation, in order to ensure that the emergency stop device is functioning properly.

A monitoring circuit 178 of the potential of the cutting element is also provided. It is built around a voltmeter and is also connected to the electronic control card 126 of the electric drive motor 120 to cause an emergency stop when an electric potential of the cutting element becomes different from a set value. In the example of implementation shown, one verifies that the electric potential of the cutting element is at the reference potential of the tool.

Figure 8:
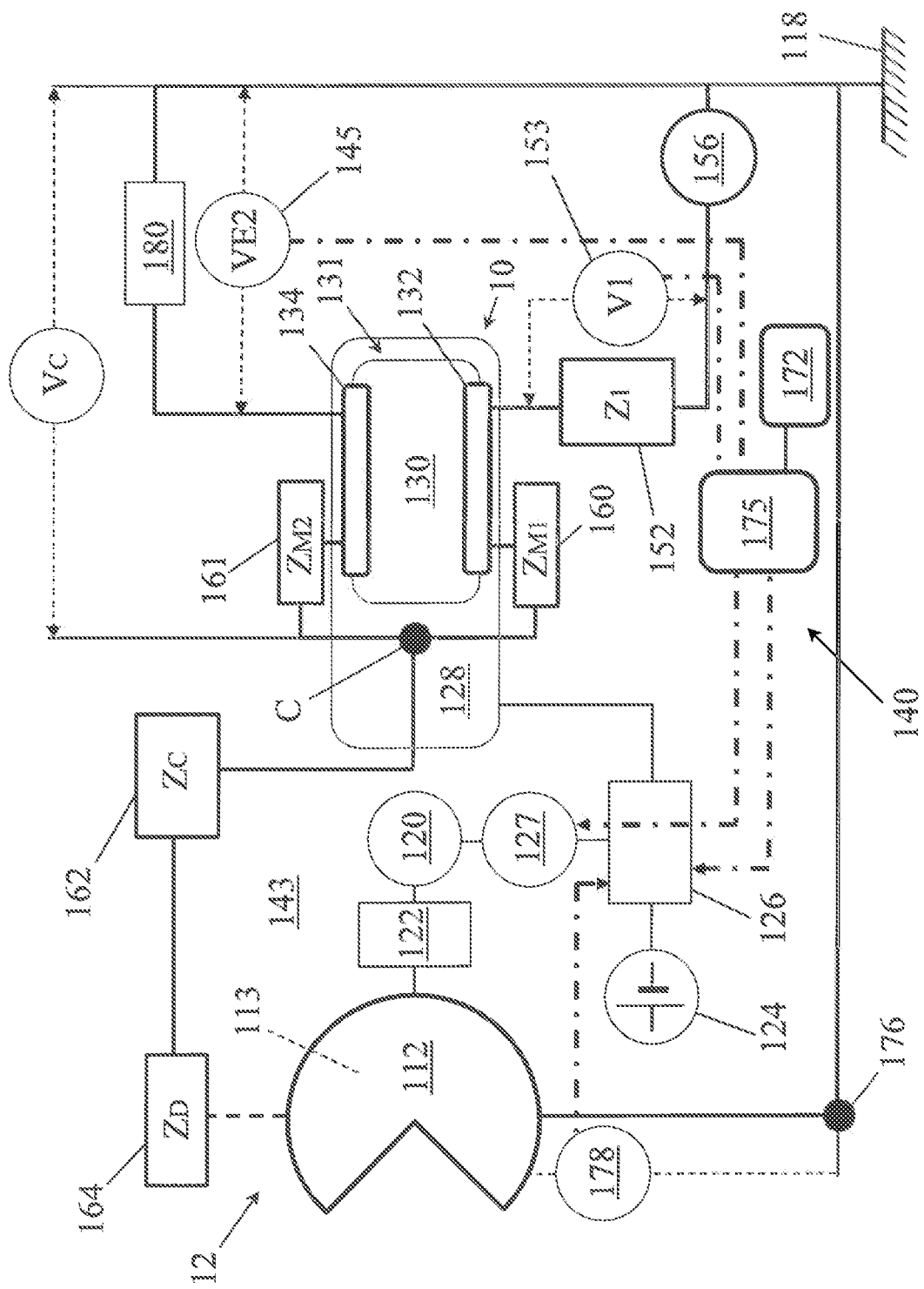
FIG. 8 is a functional schematic representation illustrating another possibility of production of a safety power tool in accordance with the invention and using the control device.

Another possibility of execution of he tool 12 is illustrated in FIG. 8 and described below.

The tool 12 of FIG. 8 presents a certain number of components that are common with that of FIG. 7, the description of which is not repeated here. It is possible to refer to FIG. 7 and to the preceding description.

An emergency stop device 140 of the electric drive motor 120 of the tool 12 is governed by an electric monitoring circuit 143. As with the tool in FIG. 7, the electric monitoring circuit 143 includes components of the tool 112 but may also include parts of the body of a human using the tool.

The electric monitoring circuit 143 includes, particularly, in series, an adjustment impedance 152, the first manual contact electrode 132 of the impedance-measuring interface 131, the active component 112 and an electric generator 156 of a monitoring current. The electric generator may be a source of voltage or current. It is for example, an electric battery or a rechargeable battery. The adjustment impedance 152 may be formed by one or more electrical components whose electric impedance value $Z_1$ is known. It may be included in the electric generator 156. It is, for example, an electric resistance with a value, for example, of 100 kΩ. However, its value is not critical. It may range, for example, from 1Ω to 200 kΩ. By a measurement of the voltage V1 at the terminals of the adjustment impedance 152, it is possible to determine a monitoring current Is flowing in the monitoring circuit.

The adjustment impedance 152 is not necessary when the electric generator 156 is a current source. During a closing of the electric monitoring circuit 143, the generator then supplies a current of defined value $I_S$. In the description below, the generator is considered to be a source of voltage, without however prejudging the possibility of replacing it with a current source.

In the absence of contact with an operator, the electric monitoring circuit 143 is normally an open circuit having consequently a quasi-infinite global impedance and a current of zero.

When an operator touches the impedance-measuring interface 131, his hand or finger come into contact with the manual contact electrodes 132, 134 and hence with the first manual contact electrode 132. The first electric circuit 143 remains open.

However, when the operator also touches the active component 112, for example, with a finger of his free hand, he closes the electric monitoring circuit 143. In this case, the adjustment impedance 152 finds itself in series successively with the first manual contact electrode 132, a contact impedance 160 of the operator's hand or finger with the first manual contact electrode 132, an impedance 162 of the operator's body, a contact impedance 164 of the operator's finger with the active component 112, and, finally the active component 112.

The values of the contact impedance 160 of the hand or finger with the first manual contact electrode 162, the impedance 162 of the body and of the contact impedance 164 of the finger with the active component are marked $Z_{M1}$, $Z_C$ et $Z_D$ respectively.

Thus, when the first circuit is closed, a total impedance $Z_T$ is such that:

$$Z_T = Z_1 + Z_{M1} + Z_C + Z_D$$

The impedance of wiring and active component are being ignored here.

Also ignored is the impedance of the electric generator 156 which is considered here to be a voltage source.

When the monitoring circuit 143 is closed, the generator 156 causes an Is monitoring current to flow in the circuit.

The value of the current Is can be predefined by the current generator when it includes a current source. It can also be predetermined based on a voltage measurement made on the terminals of the adjustment impedance 152 when the generator includes a voltage source, for example. Measurement of voltage $V_1$ at the terminals of the adjustment impedance 152, of value $Z_1$, is taken by an integrated voltmeter 153.

A voltage measuring device 145, for example, another integrated voltmeter, is connected between the ground 118 of the tool 12 and the second manual contact electrode 134. It measures a potential $V_{E2}$, or more precisely a monitoring voltage $V_{E2}$ between the ground 118 and the second manual contact electrode 134.

The monitoring voltage $V_{E2}$ as well as the voltage delivered by the integrated voltmeter 153 are supplied to a digital management unit 175.

The digital management unit, for example a microcontroller, or a dedicated integrated circuit, allows various operations to be performed.

A first operation consists of calculating the monitoring current Is by performing a ratio $V_1/Z_1$.

A second operation may consist of calculating an impedance value Z based on the monitoring voltage and the monitoring current. By referring to the preceding description, it is recalled that:

$$Z=Z_C+Z_D=V_{E2}/I_S$$

Finally, and mainly, the digital management unit 175 constitutes a comparator.

In particular, it can be used to compare the impedance value Z to the threshold value $Z_{threshold}$, which increases the human body impedance value.

It can also be used to compare the monitoring voltage $V_{E2}$ to the threshold voltage $V_{threshold}$ such as $V_{threshold}=Z_{threshold} \times I_S$.

When the voltage drops below the voltage threshold value or when the impedance drops below the impedance threshold value, the threshold electrical characteristic is respectively crossed and the emergency stop is actuated.

The comparisons can be made for other parameters depending on the aforementioned parameters and also be calculated by the digital management unit 175. For example, it is possible to compare conductances rather than impedances.

Following the comparison, and when the threshold electrical characteristic has been crossed, by higher or lower values, depending on the selected characteristic, the emergency stop device 140 is actuated.

The electrical threshold characteristics used by the comparator of the digital management unit, for example the values $V_{threshold}$ or $Z_{threshold}$, can be stored in a memory 172 associated with a digital management unit 175.

In the example of FIG. 8, the emergency stop device also includes the electronic control card 126 for the electric drive motor 120. The electronic control card 126 receives the emergency stop signal as indicated by a dot-and-dash line. In this case, the motor electronic control card is configured to actuate a movement of the drive motor itself to counteract the movement of the active component 112 and/or to cause an electromagnetic braking of the motor and of the active component by using the inductive circuits of the electric motor.

This results in an almost instantaneous stop of the movement of the active tool.

After the stop of the active component 112, a cutoff of the electric power supply can also be done. It can be effectuated by a switch 127, and in particular a transistor switch, servo-driven by the digital management unit 175.

It should be noted that the digital management unit 175, and in particular, the comparator which it constitutes, as well as the electronic control card 126 of the drive motor 120 can be produced in the form of a single integrated component.

Reference 180 designates an impedance to ground. In the example of FIG. 8 this is an electric resistance greater than 1 MΩ connected between the second manual contact electrode 134 and the ground 118 of the tool 12. It prevents a floating voltage of the second manual contact electrode 134. It is also capable of setting the voltage of the second manual contact electrode 134 at a value of zero when the second manual electrode is not in contact with the operator's hand or finger.

Measurement of a monitoring voltage of zero by the voltage measuring device 145 can thus be exploited by the digital management unit 175 to inhibit the operation of the tool or to cause an emergency stop. In the example of FIG. 8, the electric power supply to the drive motor 120 can simply be inhibited in the case of a measurement of zero monitoring voltage.

This makes it possible, for example, to prevent the operation of the tool when it is being held by an operator wearing insulating gloves that would prevent the detection of a contact with the cutting element.

Almost no current flows through the grounding impedance 180 or the operator's finger in contact with the second manual contact electrode 134 of the impedance-measuring interface 131. Thus, the potential $V_{E2}$ measured on the second manual contact electrode 134 is quasi-identical to a potential $V_C$ which would be measured between an imaginary point C inside the operator's body who touches the impedance-measuring interface 131 and the active component 112, and thereby the ground of the tool.

The reference 176 designates a control electrode which is electrically connected to the cutting element 12 in the manner already described with reference to FIG. 7.

A monitoring circuit 178 of the potential of the cutting element is also provided. It is built around a voltmeter and is also connected to the electronic control card 126 of the electric motor 120 to cause an emergency stop when an electric potential of the active component 112 becomes different from a set value. In the example of implementation shown, it is checked that the electrical potential of the cutting element is at the ground potential of the tool. The voltmeter can be an integrated component being part of the same electronic card as the digital management unit.

In the preceding description, the drive motor of the active component is an electric motor. When the drive motor is a heat engine, the electronic control card 126 can be replaced by a fuel supply and/or ignition control card. When the drive motor is a heat engine, an electromagnetic or electromechanical brake acting on the engine 120, the transmission 122 or directly on the active component 112, can be servo-driven by the comparator 174 in FIG. 7 or by the digital management unit 175 in FIG. 8, in order to cause a rapid emergency stop. The electromagnetic or electromechanical brake is not shown on the figures.

In the case of an electric drive motor, an electromagnetic braking can be performed directly by the motor 120 itself, for example, by short-circuiting its phases.

The invention claimed is:

1. Control device for a power tool, the control device comprising:
   an operation control interface provided with a manually actuated controller, presenting a manual bearing surface for movement of the controller between an off position and at least one operating position;
   a safety impedance-measuring interface, including a first manual contact electrode and a second manual contact electrode, which are electrically insulated from each other, and in which the manual contact electrodes are positioned on the controller and extend on the manual bearing surface of the controller.

2. Device according to claim 1, wherein the controller presents at least one of a recessed relief, and an insulating electric separator including a material selected from a moisture-absorbing material and a water repellent material, the first recessed relief, respectively the separator extending on the manual bearing surface, between the first manual contact electrode and the second manual contact electrode.

3. Device according to claim 2, wherein the first recessed relief is a relief with angular edges.

4. Device according to claim 2, wherein the controller presents an elongated shape and in which the first and the second manual contact electrode and said first recessed relief extend longitudinally on the controller.

5. Device according to claim 2, wherein the controller includes one of a lever trigger and a pushbutton.

6. Device according to claim 2, wherein the controller includes a lever in which the first recessed relief extends a first face of the lever forming the manual bearing surface.

7. Device according to claim 6, wherein the lever includes at least a second recessed relief extending on a second face of the lever, opposite the first face of the lever.

8. Device according to claim 2, wherein the controller includes a central body of electrically insulating material and fittings in an electrically conductive material recessed on side flanks of the central body, the fittings forming respectively the first manual contact electrode and the second manual contact electrode of the impedance-measuring interface.

9. Device according to claim 1, which the impedance-measuring interface includes at least one electrically conductive glove worn by an operator of the control device.

10. Safety power tool comprising:
an active, electrically conductive component:
a control device;
drive motor of the active component;
a monitoring device with a comparator of electric characteristics, responsive to an operator's contact with the active component;
an emergency stop device for the active component servo-driven by the monitoring device;
characterized in that:
the control device is in accordance with claim 1;
the drive motor of the active component is controlled through the intermediary of the operation control interface of the control device; and
the monitoring device includes the impedance-measuring safety interface of the control device.

11. Tool according to claim 10, wherein the monitoring device comprises:
a first electric circuit including the first manual contact electrode, a first electric impedance and the active component, the first electric circuit is capable of closing, upon a simultaneous contact of the operator with said first manual contact electrode and the active component;
a second electric circuit including the first and the second manual contact electrode, the first electric impedance and a second electric impedance, the second electric circuit is capable of closing upon a simultaneous contact of the operator with the first and the second manual contact electrodes;
at least one measuring device of an impedance characteristic of the first electric circuit and an impedance characteristic of the second electric circuit;
a comparator of the impedance characteristic of the first electric circuit and at least one threshold characteristic dependent on the impedance characteristic of the second electric circuit, the comparator being connected to the emergency stop device to cause an emergency stop in case of a crossing of the threshold characteristic.

12. Tool according to claim 11, in which wherein the second electric circuit includes a switch, the switch being servo-driven by the operation control interface to open the second circuit when the controller is in operating position, and to close the second circuit when the controller is in the off-position; the measuring device being configured to measure an impedance characteristic of the first electric circuit (142) when the second electric circuit is open and to measure an impedance characteristic of the second electric circuit when the second electric circuit is closed.

13. Tool according to claim 12, any wherein the monitoring electrical characteristic is one of the following:
a voltage equal to the monitoring voltage, or dependent on the monitoring voltage, the threshold electrical characteristic being equal to the product of the impedance value which increases the human body conduction impedance value and the monitoring current;
an impedance value dependent on the monitoring voltage and the monitoring current; the threshold characteristic being an impedance value dependent on the impedance value which increases the human body conduction impedance value;
a ratio of the monitoring voltage to the monitoring current, the threshold characteristic being equal to the impedance value which increases the human body conduction impedance value.

14. Tool according to claim 10, wherein the monitoring device comprises:
an electric monitoring circuit including the first manual contact electrode and the active component, the electric monitoring circuit is capable of closing upon a simultaneous contact of the operator with said first manual contact electrode and the active component;
an electric generator of a monitoring current in the first electric circuit;
a measuring device a monitoring voltage between the active component and the second manual contact electrode;
a comparator of at least one monitoring electrical characteristic dependent on the monitoring voltage and a threshold electrical characteristic dependent on the impedance value which increases the human body conduction impedance value, the comparator being connected to the emergency stop device to cause an emergency stop when the monitoring electrical characteristic crosses the threshold electrical characteristic.

15. Tool according to claim 14, wherein the monitoring electrical characteristic is a voltage dependent on the monitoring voltage and in which the threshold electrical characteristic is a threshold voltage dependent on the impedance value which increases the human body conduction impedance value and the monitoring current.

16. Tool according to claim 14, wherein the monitoring electrical characteristic is one of the following:
a voltage equal to the monitoring voltage, or dependent on the monitoring voltage, the threshold electrical characteristic being equal to the product of the impedance value which increases the human body conduction impedance value and the monitoring current;
an impedance value dependent on the monitoring voltage and the monitoring current;
the threshold characteristic being an impedance value dependent on the impedance value which increases the human body conduction impedance value;
a ratio of the monitoring voltage to the monitoring current, the threshold characteristic being equal to the impedance value which increases the human body conduction impedance value.

* * * * *